United States Patent [19]

Taguchi

[11] Patent Number: 5,176,759
[45] Date of Patent: Jan. 5, 1993

[54] PASTE SOLDER WITH MINIMIZED RESIDUE

[75] Inventor: Toshihiko Taguchi, Saitama, Japan

[73] Assignee: Senju Metal Industry Co., Ltd., Tokyo, Japan

[21] Appl. No.: 806,395

[22] Filed: Dec. 13, 1991

[30] Foreign Application Priority Data

Dec. 14, 1990 [JP] Japan ................... 2-410680

[51] Int. Cl.⁵ .............................. B23K 35/34
[52] U.S. Cl. ...................... 148/24; 148/23; 148/25
[58] Field of Search .................. 148/23-25

[56] References Cited

U.S. PATENT DOCUMENTS 4,759,490  7/1988  Ochiai ................... 148/24

FOREIGN PATENT DOCUMENTS 56-154297  11/1981  Japan .
57-118891   7/1982  Japan .
59-153594   9/1984  Japan .
60-180690   9/1985  Japan .
60-257988  12/1985  Japan .
61-15798    4/1986  Japan .
61-78589    4/1986  Japan .
61-108491   5/1986  Japan .
2-25291     1/1990  Japan .

Primary Examiner—Peter D. Rosenberg
Attorney, Agent, or Firm—Sughrue, Mion, Zinn, Macpeak & Seas

[57] ABSTRACT

A paste solder with minimized flux residue remaining after soldering comprises a powdered solder and a flux in admixture. The flux comprises from about 5% to about 40% by weight of carrier components which comprise a rosin or a rosin derivative, an activating agent, and a thixotropic agent and from about 60% to about 95% by weight of a solvent which predominantly comprises a 2-alkyl-1,3-hexanediol having 1 to 4 carbon atoms in the alkyl group.

14 Claims, No Drawings

PASTE SOLDER WITH MINIMIZED RESIDUE

BACKGROUND OF THE INVENTION

The present invention relates to a paste solder which comprises a powdered solder uniformly admixed with a flux. More particularly, it relates to a paste solder which leaves a minimized amount of flux residue after soldering and which is suitable for use in an inert or reducing atmosphere.

Paste solder (also called cream solder) is a paste-like, uniform mixture of a powdered solder and a pasty flux. It has rheological properties suitable for printing and adhesion. Therefore, it can be readily and accurately applied by printing, and the applied solder can hold the elements mounted thereon before soldering due to its adhesiveness without the use of an adhesive. A paste solder is also advantageous in that it can be used to solder many elements simultaneously by employing an atmosphere-heating means such as a reflow furnace. Due to these characteristics, paste solder has contributed to advance in surface mounting techniques for the manufacture of printed circuit boards.

Soldering with a paste solder is performed, for example, by applying the paste solder to the areas to be soldered on the surface of a circuit board by printing using a stencil and a squeegee. One or more electronic elements to be mounted on the surface of the circuit board, such as IC modules, chip capacitors, chip resistors, or the like are then placed on the printed paste solder and temporarily secured in place by the adhesive power of the solder. Subsequently, the solder is heated to melt in a heating apparatus such as a reflow furnace, thereby soldering the electronic elements to the circuit board to form an electronic device.

Thus, surface mounting using a paste solder makes it possible to solder electronic elements with a decreased number of steps and an increased accuracy. Therefore, it is growing increasingly popular and becoming the prevalent soldering method as the demand for high-density mounting and cost savings in the manufacture of electronic devices increases.

A paste solder which has conventionally been used consists of about 85%-92% of a powdered solder and about 8%-15% of a flux on a weight basis. The flux comprises the following ingredients:
50%-70% by weight of a rosin or its derivative,
2%-7% by weight of a thixotropic agent,
0.1%-5% by weight of an activating agent, and
30%-45% by weight of a solvent.

The rosin or rosin derivative is the main fluxing agent of a flux and it constitutes carrier components of a flux along with the remaining ingredients other than the solvent.

The paste solder is prepared by heating the ingredients of a flux together to dissolve the carrier components in the solvent and form a homogeneous solution. The solution is then cooled to form a paste and the resulting pasty flux is uniformly mixed with a powdered solder to give a paste solder.

Such a paste solder should meet the following requirements.

(1) No separation between the powdered solder and flux.

(2) Good printability, i.e., capable of smooth printing by means of a stencil and squeegee.

(3) Good adhesiveness, i.e., capable of holding and temporarily securing electronic elements when they are mounted on the printed paste solder.

(4) Good retention of the printed solder shape before or even after it is preliminary heated.

(5) No solder balls formed when the printed solder having electronic elements temporarily secured thereon is heated by a reflow furnace, for example.

(6) A flux residue remaining after soldering with the paste solder is non-corrosive and has good electrical insulating properties.

(7) The flux residue can be readily dissolved out and removed by washing with a washing solvent, which is usually a halogenated hydrocarbon solvent.

A flux residue remaining after soldering has the following undesirable effects.

(a) When a relatively large amount of a flux residue remains after soldering, it not only worsens the appearance of soldered portions but also makes it impossible to perform a continuity test with a checking pin to confirm that the mounted elements are well soldered so as to operate the device satisfactorily.

(b) Some fluxes are corrosive or hygroscopic in nature due to their formulations. When an electrical current is passed through a circuit soldered with such a flux, the remaining flux residue of such a flux may cause corrosion or migration of the solder or decrease the insulation resistance between conductors. This is particularly undesirable in an industrial or life support system which must operate reliably for many years.

In order to eliminate these undesirable effects of a flux residue, it is common, after soldering with a conventional paste solder, to wash the soldered electronic device with an organic halogenated solvent including a fluorinated and/or chlorinated hydrocarbon to remove the flux residue. However, the use of such a halogenated solvent is now regulated to prevent an adverse environmental impact, and it is expected to be completely prohibited in the future.

It is conceivable to use water or another organic solvent in place of an organic halogenated solvent in the washing step after soldering. However, if water is used, it is necessary to dispose of the waste water by a complicated process, while other organic solvents involve problems with respect to flammability or costs. Therefore, replacement of a halogenated solvent by water or other organic solvent has scarcely been realized.

As described above, a flux used in a conventional paste solder contains a rosin or its derivative as a main fluxing agent in a relatively large amount (on the order of 50% by weight or more). Correspondingly, the amount of the solvent is as low as 45% by weight at most. See, Japanese Patent Publication (JPB) No. 61-15798(1986) and Japanese Patent Laid-Open Applications (JPA) Nos. 56-154297(1981), 57-118891(1982), 59-153594(1984), 60-180690(1985), 60-257988(1985), 61-78589(1986), and 61-108491(1986).

Accordingly, a water-soluble organic solvent having a relatively low viscosity is commonly used to prepare a flux for a paste solder in order to provide the resulting paste solder with desirable properties such as printability, adhesion for holding electronic elements, and retention of printed shape. Examples of such a solvent used in the prior art are diethylene glycol monobutyl ether, diethylene glycol monobutyl ether acetate, triethylene glycol monomethyl ether, tripropylene glycol monomethyl ether, ethylene glycol monophenyl ether, propylene glycol monophenyl ether, diethylene glycol monohexyl ether, diethylene glycol mono-2-ethylhexyl ether, ethylene glycol, propylene glycol, dipropylene glycol, butanediol, hexylene glycol, phenol, benzyl alcohol, and the like.

Due to the high rosin content of the flux, the conventional paste solder inevitably leaves a considerable amount of a flux residue after soldering and therefore it has been essential to conduct the above-mentioned washing procedure to remove the residual flux.

JPA 2-25291(1990) discloses a paste solder for use in a reducing atmosphere which comprises a powdered solder and at least one binder material including an alcohol. Since it is a flux-free solder, it is necessary to conduct soldering therewith in a reducing atmosphere which functions as a flux. If the paste solder is used in an inert atmosphere, soldering will not be performed satisfactorily due to the absence of a flux. In addition, the solder is a simple mixture of a powdered solder and an organic solvent. Therefore, the pasty nature is soon lost, since the powdered solder settles out in the organic solvent so as to separate therefrom. Naturally, the solder cannot be applied by printing, and even though the solder can be applied to those areas of a board to be soldered, the applied solder does not have adhesion sufficient to hold electronic elements in place on the board.

SUMMARY OF THE INVENTION

It is an object of the invention to provide a paste solder in which the amount of a flux residue remaining after soldering is minimized to such a degree that it is hardly detectable by visual inspection. Such a paste solder affords a good finished appearance in the soldered portions and makes it easy to perform a continuity test by means of pin contact.

Another object of the invention is to provide a paste solder with minimized flux residue and high reliability in which the flux is substantially non-corrosive and has good insulating properties so that it is no longer necessary to remove a flux residue, if any remains after soldering in a small amount.

A further object of the invention is to provide a paste solder having good printability along with appropriate adhesion which lies in a useful region enabling the paste to hold electronic elements without aid of an adhesive.

It has been found that the total amount of the carrier components, which was at least 55% by weight in a conventional paste solder, can be decreased to 40% by weight or less by selecting a suitable solvent and that the resulting carrier-lean, solvent-rich paste solder effectively functions as a solder by reflowing not only in a reducing atmosphere but also in an inert atmosphere. Such a paste solder leaves a minimized amount of flux residue after soldering due to the decreased proportion of the carrier components and eliminates the necessity of removing the residual flux by washing. It has also been found that a 2-alkyl-1,3-hexanediol is particularly suitable as a solvent for such a carrier-lean solder.

The present invention provides a paste solder with minimized residue which comprises a powdered solder and a flux in admixture, wherein the flux comprises from about 5% to about 40% by weight of carrier components which comprise a rosin or a rosin derivative as a main fluxing agent, an activating agent, and a thixotropic agent and from about 60% to about 95% by weight of a solvent which predominantly comprises a 2-alkyl-1,3-hexanediol having 1 to 4 carbon atoms in the alkyl group. The paste solder can be reflowed in either an inert or reducing atmosphere for reflow.

DETAILED DESCRIPTION OF THE INVENTION

The powdered solder which is present in the paste solder of the present invention may be selected from those solders which have been used in a conventional paste solder according to the purpose of soldering. Examples of solders useful for surface mounting of electronic elements include Sn-Pb, Sn-Pb-Ag, Sn-Pb-Bi, Sn-Pb-In, Sn-Pb-Sb, and similar alloys. The particle shape and size of the powdered solder are not critical. However, in view of the recent trend of surface mounting with a narrow pitch distance between adjacent leads, it is preferred that the powdered solder be spheres and have a particle size of about 250-400 mesh.

The carrier components of the flux useful in the paste solder of the present invention may also be the same as those used in conventional paste solders. Specifically, the carrier components comprise a main fluxing agent, an activating agent, and a thixotropic agent. Since part of the carrier components remain as a flux residue after soldering, the carrier components are preferably present in a small amount in order to minimize the amount of flux residue. Therefore, they are present in a total amount of about 5%—about 40% by weight based on the total weight of the flux according to the present invention. When the carrier components are present in a total amount of more than about 40% by weight, the amount of flux residue remaining after soldering will be so increased that removal of the flux residue by washing is necessary in order to obtain a good finished appearance and make it easy to perform a continuity test by pin contact. When the total amount of the carrier components is less than about 5% by weight, soldering will not be effected satisfactorily, resulting in the formation of many solder balls, particularly in the case where reflow is performed in an inert atmosphere. Preferably the total amount of the carrier components is from about 10% to about 35% based on the total weight of the flux.

The rosin or rosin derivative used as a main fluxing agent of the flux serves to enhance the solderability, printability, and adhesiveness of the resulting paste solder. Examples of useful rosins or rosin derivatives are gum rosin, wood rosin, polymerized rosin, and phenol-modified rosin. The rosin or rosin derivative is preferably present in the flux in a small amount of from about 3% to about 30% based on the total weight of the flux.

The activating agent is present in the paste solder in order to enhance the solderability (fluxing activity) of the solder. The amount of the main fluxing agent present in the flux of the paste solder of the present invention is smaller than that used in a conventional paste solder. Therefore, if the activating agent is added in an amount comparable to that added to a conventional paste solder, it is excessive relative to the main fluxing agent. Since the paste solder of the present invention is required to form a minimized amount of a flux residue after soldering such that the removal of the flux residue is no longer necessary, the amount of the activating agent added to the flux should be as low as possible provided that the reliability of the flux (non-corrosive nature and insulation resistance) is not impaired while retaining good solderability with minimized formation of solder balls and preventing a significant degradation of the paste solder with time. The amount of the activating agent added to the flux varies depending on the particular activating agent, but it is generally in the range of about 0.1% to about 2% by weight based on the total weight of the flux.

Examples of useful activating agents are organic amine hydrohalide salts, organic acids, and organic amines. Specific examples of suitable activating agents include diphenylguanidine hydrobromide, cyclohexylamine hydrobromide, diethylamine hydrochloride, adipic acid, sebacic acid, triethanolamine, monoethanolamine, and the like.

The thixotropic agent is added in an amount sufficient to prevent the separation of the powdered solder from the flux and adjust the viscosity of the resulting paste solder so as to be suitable for printing. Generally, the thixotropic agent is added to the flux in an amount of from about 4% to about 10% by weight based on the total weight of the flux. Examples of useful thixotropic agents are hydrogenated castor oil, fatty acid amides, hydroxyfatty acids, and the like.

It is a feature of the invention that a 2-alkyl-1,3-hexanediol, which is a branched diol of the following formula, is used as a predominant component of the solvent in the flux:

$$CH_2(OH)CH(R)CH(OH)CH_2CH_2CH_3$$

wherein R is an alkyl group having 1 to 4 carbon atoms such as methyl, ethyl, propyl, isopropyl, butyl, and isobutyl. The solvent of the above formula in which R is ethyl is particularly preferred.

Any one of the branched diols of the above formula has a boiling point such that it is vaporized during reflow of the solder and an adequately high viscosity at 20° C. For example, 2-ethyl-1,3-hexanediol, which is a compound of the above formula wherein R is ethyl and which is readily available on the market, has a boiling point of 243.2° C. and a viscosity of 323 cp at 20° C. Therefore, such a diol is particularly suitable for use as a solvent in the preparation of a flux of a paste solder with minimized residue.

If the branched diol is used as a solvent in a conventional paste solder which comprises more than 50% by weight of carrier components in the flux, the resulting paste solder can not be applied by printing due to the high viscosity of the solvent. However, since the paste solder of the present invention is of the minimized residue type which comprises carrier components in a decreased amount, the use of the high-viscosity, branched diol solvent provides the resulting paste solder with optimal viscosity, printability, and adhesiveness. The solvent has another advantage in that it has an extremely low vapor pressure at ambient temperature so that it is possible to apply it by continuous printing. The vapor of the branched diol solvent is non-toxic to humans.

In contrast, those solvents listed above as solvents used in conventional paste solders have a low viscosity in the range of 0.5-50 cp. Therefore, even if it is possible to prepare a solvent-rich paste solder with minimized flux residue using such a solvent by increasing the amount of the thixotropic agent, the resulting paste solder will not be rolled satisfactorily during printing so that it cannot be applied by printing.

A solvent is present in the flux in an amount of from about 60% to about 95% and preferably from about 65% to about 90% by weight based on the total weight of the flux. The amount of the solvent is selected in this range depending on the amounts of the rosin and thixotropic agent in the flux so that the resulting paste solder has an adequate viscosity.

Any solvent predominantly comprising a 2-alkyl-1,3-hexanediol can be used in the flux of the paste solder of the present invention. Preferably the solvent consists essentially of a 2-alkyl-1,3-hexanediol and more preferably of 2-ethyl-1,3-hexanediol. In order to adjust the viscosity of the solvent, one or more additional solvents such as the above-listed low-viscosity solvents which have conventionally been used in a flux for a paste solder or other high-viscosity solvents, e.g., α-terpineol may be admixed with the 2-alkyl-1,3-hexanediol solvent in a minor amount of at most about 50% and preferably at most about 30% by weight based on the total weight of the solvent.

It has been found that the 2-alkyl-1,3-hexanediol solvent is particularly suitable for use as a solvent in a flux for a paste solder with minimized residue. Specifically, the following advantages are provided by the use of such a solvent.

(1) Due to the extremely high viscosity of the solvent compared to that conventionally used in a flux for a paste solder, it is possible to successfully form a paste solder with minimized residue. Thus, the resulting paste solder is rolled satisfactorily during printing so that it can be fed into openings of a stencil to perform printing.

(2) Due to the high boiling point (e.g., 243° C.) and low vapor pressure at ambient temperature of the solvent, the paste solder can be applied by continuous printing.

(3) The printed paste solder maintains its adhesiveness for a prolonged time after printing and therefore electronic elements can be readily mounted thereon.

(4) The branched diol solvent is non-toxic to humans, as is apparent from the fact that it is used in cosmetics.

(5) The solvent evaporates completely during the reflowing stage in soldering, leaving a minimized amount of a flux residue which consists essentially of the carrier components. Therefore, the flux residue does not result in an increase in corrosiveness, a decrease in insulation resistance, or occurrence of migration, all of which are attributed to the presence of unevaporated solvent in the flux residue.

On the contrary, if a low-viscosity solvent as exemplified above which has been conventionally used in a paste solder is used to prepare a solvent-rich paste solder with minimized residue according to the present invention, the resulting paste solder will suffer the following problems.

(1) The viscosity of the paste is so low as a paste solder that it lacks adhesiveness. As a result, the paste solder is not rolled during printing with a squeegee and it cannot be fed successfully to those areas to be soldered.

(2) When the paste solder is printed, it is too soft and fluid to maintain the printed shape as it is. Therefore, the paste solder will adhere not only to those areas to be soldered but also to other areas, resulting in the formation of solder balls which are undesirable.

(3) The soft and fluid nature of the paste solder also causes the printed solder to penetrate into the backside of the stencil during printing. Therefore, printing is very difficult.

The paste solder according to the present invention can be prepared in a conventional manner. The ingredients of the flux, i.e., a rosin or its derivative, an activating agent, a thixotropic agent, and a solvent are heated together to form a solution, which is then cooled to give a flux in the form of a paste. The paste solder can be prepared by uniformly mixing the flux with a powdered solder. The mixing proportion of these components is not critical but it is preferable to use from about 85 to about 92 parts of a powdered solder and from about 8 to about 15 parts of a flux on a weight basis. More preferably about 88-92 parts of a powdered solder are mixed with about 8-12 parts of a flux.

Preferably the resulting paste solder has a viscosity of about 1,000 to about 2,500 poise at 25° C. as measured by a Malcolm viscometer (a spiral viscometer) at 10 rpm. If necessary, a thixotropic agent may be added to adjust the viscosity of the flux or paste solder.

The following example is given as a specific illustration of the present invention. It is to be understood, however, that the example is not restrictive and the present invention is not limited thereto. In the example, all parts are by weight unless otherwise indicated.

EXAMPLE

Ninety-one (91) parts of 60Sn-Pb spherical solder (powdered solder) having a particle size of 270 mesh was uniformly mixed with 9 parts of a flux having a varying composition to give a paste solder.

The flux used was prepared by mixing a polymerized rosin (main fluxing agent), 2-ethyl-1,3-hexanediol (solvent), hydrogenated castor oil (thixotropic agent), diphenylguanidine hydrobromide (activating agent), and optionally α-terpineol (additional solvent) in the proportions shown in Table 1 and heating the mixture so as to form a homogeneous solution which was then cooled to room temperature.

Comparative paste solders were prepared in the same manner as described above except that the solvent in the flux was replaced by diethylene glycol monobutyl ether (butyl carbitol) which is the solvent most commonly used as a solvent in a flux for a conventional paste solder or 2-ethyl-2,4-pentanediol which is used as a solvent in the flux disclosed in JPA 56-154297 (1981). Another comparative paste solder which was a flux-free paste solder consisting of a powdered solder and a solvent as described in JPA 2-25291(1990) wa prepared using the above-described powdered solder and 1,6-hexanediol as a solvent.

The viscosity of each paste solder was measured at 25° C. using a Malcolm viscometer at 10 rpm. Furthermore, the paste solder was evaluated in terms of printability, adhesiveness, formation of solder balls after soldering as an indication of solderability, amount of flux residue remaining after soldering, current continuity by pin contact, and electrical insulation properties in the following manner.

Printability

The paste solder to be tested was printed on a printed circuit board with a 0.2 mm-thick metal mask and a squeegee. The printability was evaluated by visually observing the printing process as to whether or not the paste solder was rolled on the metal mask sufficiently to feed the solder to those areas to be soldered as well as the appearance of the printed solder with respect to the formation of undesirable blurring or bridging.

Adhesiveness

The adhesiveness of the paste solder was tested by an adhesion test according to the U.S. IPEC (Interconnecting and Packaging Electronic Circuits) Standard SF-819. The results were evaluated by determining the adhesion (expressed in $g/mm^2$) of a printed paste solder 1 and 4 hours after the printing.

Formation of Solder Balls (Solderability)

The paste solder was printed on a printed circuit board as described in the printability test and heated in a reflow furnace containing a nitrogen atmosphere having an oxygen content of about 100 ppm to effect soldering. The number of solder balls formed in a given circuit area was counted under a stereomicroscope of 40X magnification.

Flux Residue

The soldered, printed circuit board obtained in the solderability test was visually observed to evaluate the amount of flux residue remaining thereon and assigned one of four grades 1 to 4. Grade 1 indicates that the amount of flux residue was the smallest while grade 4 indicates the largest amount.

Continuity

A digital multimeter (Model SC-7002 manufactured by Iwasaki Communication Apparatus) was used to test the continuity by bringing the tips of two pins of the meter into contact with the solder in the same circuit.

Insulation Resistance

The paste solder was printed on a comb-shaped circuit board (Type II) for the measurement of insulation resistance as specified in JIS Z 3197 and soldering was conducted by heating in a reflow furnace containing a nitrogen atmosphere having an oxygen content of about 100 ppm. After the soldered circuit board was allowed to stand for 168 hours in a thermo-hygrostat at 85° C. and 85% relative humidity while a DC voltage of 50 volt was applied to the electrodes of the board, the insulation resistance was measured in the thermo-hygrostat.

The test results are also shown in Table 1.

As can be seen from Table 1, in spite of the high solvent content of 60% by weight or more in the flux, the paste solders according to the present invention exhibited good results with respect to all of printability, adhesiveness, and solderability and can be satisfactorily reflowed in an inert atmosphere. They formed a minimized amount of flux residue and gave good results in the continuity and insulation resistance tests. Thus, they were clearly of the type leaving a minimized amount of flux residue which can be used without a washing treatment with a harmful or toxic organic solvent for the removal of flux residue.

In contrast, even in the cases where the same solvent as the present invention was used, the use of the solvent in an amount of less than 40% by weight in the flux (Comparative Example 6) or the absence of a thixotropic agent and/or activating agent (Comparative Examples 1 to 3) did not afford good results in all the above properties.

When a low-viscosity solvent such as butyl carbitol or 2-ethyl-2,4-pentanediol was used as in the prior art, soldering could be performed satisfactorily only in those cases where the amount of the solvent in the flux was decreased to 45% by weight while increasing the amount of the rosin (main fluxing agent) as in the prior art (Comparative Examples 5 and 8). However, in these cases, a flux residue remained after soldering in an increased amount and the continuity and insulation properties were thereby degraded, leading to the necessity of removing the flux residue by washing with a harmful solvent. When the low-viscosity solvent was used in an increased amount as in the present invention in order to decrease the amount of flux residue (Comparative Examples 7 and 9), printing could not be performed successfully due to a deterioration in printability. Furthermore, the adhesiveness of the printed solder was also decreased and the paste could not hold electronic elements satisfactorily. With the flux-free paste solder consisting of a powdered solder and a solvent (Comparative Example 4), printing was impossible.

As described above, unlike the flux-free paste solder described in JPA 2-25291(1990), the paste solder of the present invention has good printability and adhesiveness and can be reflowed not only in a reducing atmosphere but also in an inert atmosphere. Due to the relatively high concentration of a solvent and correspondingly low concentration of carrier components in the flux, the amount of flux residue remaining after soldering is very small and the flux residue is non-corrosive and has good insulation properties. Therefore, there is no need of removing the flux residue by washing. Despite the low content of the carrier components, the flux can perform its function (cleaning the areas to be soldered to increase the wettability thereof) satisfactorily even in reflowing in an inert atmosphere, thereby ensuring soldering of good quality.

Thus, the paste solder of the present invention meets all the requirements (1) to (6) given above for a paste solder and it can be used without the need of removal of flux residue by washing with a halogenated solvent after soldering. Therefore, soldering can be conducted by a simpler process without the use of a harmful solvent, thereby decreasing the manufacturing costs of electronic devices.

Although the present invention has been described with respect to preferred embodiments, it is to be understood that variations and modifications may be employed without departing from the concept of the invention as defined in the following claims.

TABLE 1

| Example No. | Composition of Flux (% by weight) | | | | | Printability | Adhesion (g/mm$^2$) | |
| --- | --- | --- | --- | --- | --- | --- | --- | --- |
| | Rosin[1] | Diol[2] Solvent | Castor Oil[3] | DPG HBr[4] | Other Solvent[5] | | After 1 hour | After 4 hours |
| Example 1 | 25 | 68.7 | 6 | 0.3 | — | Rolled, good printing | 2.2 | 2.5 |
| Example 2 | 15 | 77.7 | 7 | 0.3 | — | Rolled, good printing | 2.2 | 2.2 |
| Example 3 | 10 | 82.7 | 7 | 0.3 | — | Rolled, good printing | 2.0 | 2.0 |
| Example 4 | 25 | 37.7 | 7 | 0.3 | TP 30 | Rolled, good printing | 2.0 | 0.5 |
| Compar. Examp. 1 | 30 | 69.7 | — | 0.3 | — | Solder settled out (unprintable) | 1.5 | 1.5 |
| Compar. Examp. 2 | 40 | 60 | — | — | — | Solder settled out (unprintable) | 2.5 | 2.8 |
| Compar. Examp. 3 | 25 | 68 | 7 | — | — | Rolled, good printing | 2.0 | 2.2 |
| Compar. Examp. 4 | — | — | — | — | HD 100 | Solder settled out (unprintable) | Unmeasurable | Unmeasurable |
| Compar. Examp. 5 | 66 | — | 4 | 2.0 | BC 28 | Rolled, good printing | 3.0 | 2.0 |
| Compar. Examp. 6 | 60 | 34 | 4 | 2.0 | — | Too thick, unprintable | 3.5 | 4.0 |
| Compar. Examp. 7 | 25 | — | 8 | 0.3 | BC 66.7 | Too thin, blurring and bridging found | 1.0 | 0.5 |
| Compar. Examp. 8 | 55 | — | 6 | 2.0 | MPD 37 | Rolled, good printing | 4.0 | 4.0 |
| Compar. Examp. 9 | 30 | — | 8 | 2.0 | MPD 60 | Too thin, blurring and bridging found | 1.2 | 1.6 |

| Example No. | Number of Solder Balls | Flux Residue | Continuity Test by Pin Contact | Insulation Resistance ($\Omega$) | Viscosity at 25° C., 10 rpm (Poise) |
| --- | --- | --- | --- | --- | --- |
| Example 1 | 10 | 1.5 | Passed | $\geq 1.0 \times 10^{10}$ | 1,500 |
| Example 2 | 25 | 1.0 | " | " | 1,500 |
| Example 3 | 30 | 1.0 | " | " | 1,000 |
| Example 4 | 10 | 1.5 | " | " | 1,300 |
| Compar. Examp. 1 | 500 | 2.0 | Passed by pressing | $\geq 1.0 \times 10^{10}$ | 1,000 |
| Compar. Examp. 2 | 500 | 3.0 | Passed by pressing | " | 1,300 |
| Compar. Examp. 3 | 250 | 1.5 | Passed | " | 1,500 |
| Compar. Examp. 4 | All balls[6] | None | Unmeasurable | Unmeasurable | Unmeasurable |
| Compar. Examp. 5 | 7 | 4.0 | Failure | $1.0 \times 10^{8}$ | 2,500 |
| Compar. Examp. 6 | 8 | 4.0 | Failure | " | 3,000 |
| Compar. Examp. 7 | 10 | 1.5 | Passed | $1.0 \times 10^{10}$ | 810 |

TABLE 1-continued

| | | | | | |
|---|---|---|---|---|---|
| Compar. Examp. 8 | 5 | 4.0 | Failure | $1.0 \times 10^8$ | 2,400 |
| Compar. Examp. 9 | 10 | 2.0 | Passed | " | 1,300 |

[1] Polymerized rosin;
[2] 2-Ethyl-1,3-hexanediol;
[3] Hydrogenated castor Oil;
[4] Diphenylguanidine hydrobromide;
[5] TP = α-Terpineol, HD = 1,6-Hexanediol, BC = Butyl carbitol, MPD = 2-Methyl-2,4-pentanediol;
[6] Not reflowed and all the solder formed solder balls.

What is claimed is:

1. A paste solder with minimized residue which comprises a powdered solder and a flux in admixture, wherein the flux comprises from about 5% to about 40% by weight of carrier components which comprise a rosin or a rosin derivative as a main fluxing agent, an activating agent, and a thixotropic agent and from about 60% to about 95% by weight of a solvent which predominantly comprises a 2-alkyl-1,3-hexanediol having 1 to 4 carbon atoms in the alkyl group.

2. The paste solder of claim 1, wherein the flux comprises from about 10% to about 35% by weight of carrier components and from about 65% to about 90% by weight of solvent.

3. The paste solder of claim 1, wherein the solvent comprises predominantly 2-ethyl-1,3-hexanediol.

4. The paste solder of claim 1, wherein the powdered solder is a spherical solder having a particle size of 250–400 mesh.

5. The paste solder of claim 1, wherein the main fluxing agent is present in an amount of about 3%—about 30% by weight based on the total weight of the flux.

6. The paste solder of claim 1, wherein the main fluxing agent is selected from the group consisting of gum rosin, wood rosin, polymerized rosin, and phenol-modified rosin.

7. The paste solder of claim 1, wherein the activating agent is present in an amount of about 0.1%—about 2% by weight based on the total weight of the flux.

8. The paste solder of claim 1, wherein the activating agent is selected from the group consisting of organic amines, amine hydrohalide salts, and organic acids.

9. The paste solder of claim 1, wherein the thixotropic agent is present in an amount of about 4%—about 10% by weight based on the total weight of the flux.

10. The paste solder of claim 1, wherein the thixotropic agent is selected from the group consisting of hydrogenated castor oil, fatty acid amides, and hydroxyfatty acids.

11. The paste solder of claim 1, wherein the solvent consists essentially of a 2-alkyl-1,3-hexanediol.

12. The paste solder of claim 1, wherein the solvent comprises a major amount of a 2-alkyl-1,3-hexanediol and a minor amount of one or more additional solvents.

13. The paste solder of claim 12, wherein the additional solvents comprise α-terpineol.

14. A method of soldering electronic elements on a printed circuit board, comprising applying the paste solder of claim 1 to areas to be soldered on a printed circuit board by printing, mounting electronic elements on the printed paste solder, and reflowing the paste solder in an inert or reducing atmosphere.

* * * * *